United States Patent
Lin et al.

(10) Patent No.: US 6,877,954 B2
(45) Date of Patent: Apr. 12, 2005

(54) ECCENTRIC HEAT DISPENSING FANS

(76) Inventors: Shueei-Muh Lin, No. 17, Lane 99, Ming-Shin Road, Tainan City (TW); Sen-Yung Lee, 9F, No. 84, Section 3, Chang-Rong Road, Tainan City (TW)

( * ) Notice: Subject to any disclaimer, the term of this patent is extended or adjusted under 35 U.S.C. 154(b) by 50 days.

(21) Appl. No.: 10/408,438

(22) Filed: Apr. 8, 2003

(65) Prior Publication Data

US 2004/0202535 A1 Oct. 14, 2004

(51) Int. Cl.[7] ............................................. F04D 29/00
(52) U.S. Cl. ........................ 416/175; 416/185; 416/203
(58) Field of Search ................................. 415/175, 176, 415/177, 178, 203, 206, 228, 231 B; 416/175, 203, 183, 185, 188; 361/395

(56) References Cited

U.S. PATENT DOCUMENTS 6,540,476 B2 * 4/2003 Huang et al. ................. 415/98
6,568,905 B2 * 5/2003 Horng et al. ................ 415/206
6,736,610 B2 * 5/2004 Cifarelli ...................... 417/366

* cited by examiner

Primary Examiner—F. Daniel Lopez
Assistant Examiner—Dwayne White
(74) Attorney, Agent, or Firm—Rosenberg, Klein & Lee

(57) ABSTRACT

A heat dispensing fan includes a hub having a recess defined in a top thereof so as to receive a fan member therein. The recess communicates with a side outlet in the hub and apertures defined through the hub. The fan member has a ring-shaped base plate and a protrusion extends from a center of a top of the base plate. A plurality of first curve blades extends from the protrusion and a plurality of second curve blades are located on the top of the base plate. Each first curve blade is connected to one of the second curve blades. A top cap is connected to the hub and has a hole defined therethrough.

5 Claims, 7 Drawing Sheets

ECCENTRIC HEAT DISPENSING FANS

FIELD OF THE INVENTION

The present invention relates to an eccentric heat dispensing fan used for dispensing heat from CPU and includes inner blades and outer blades so as to increase the volume of the air blow to effectively dispense heat away from the CPU.

BACKGROUND OF THE INVENTION

A conventional heat dispensing fan is shown in FIG. 1 and generally includes a base plate with a plurality of blades thereon. FIGS. 2 and 3 show a developed version of the heat dispensing fan which includes a base plate with a plurality of blades on both sides of the base plate, the base is rotatably received in a hub which includes a top opening, two bottom openings and a side outlet. When the base plate is rotated, air is sucked in the hub via the openings and then flows out from the side outlet. However, the volume of air sucked from the opening in the top of the hub and the volume of air sucked from the openings in the bottom of the hub are not balanced so that the base plate shakes during operation. The base plate stops the communication between the top opening and the two bottom openings so that a back-pressure is occurred to reduce the efficiency of the fan. The blades are straight on the two sides of the base plate and this is disadvantage to the air flow.

The present invention intends to provide a heat dispensing fan that has curve blades arranged into two circles and the base plate has holes allowing air passing through.

SUMMARY OF THE INVENTION

In accordance with one aspect of the present invention, there is provided a heat dispensing fan which comprises a hub having a recess defined in a top thereof and communicating with a side outlet. Apertures are defined through the hub and communicate with the recess.

A fan member has a ring-shaped base plate and a protrusion extends from a center of a top of the base plate. A plurality of first curve blades extend from the protrusion and are located on a top of the base plate. A plurality of second curve blades are located on the top of the base plate and each first curve blade is connected to one of the second curve blades.

A top cap is connected to the hub and has a hole defined therethrough.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
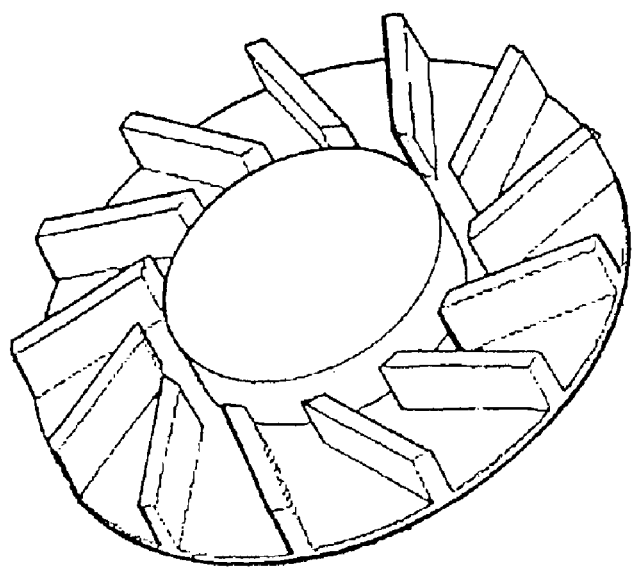
FIG. 1 is a perspective view to show a first conventional dispensing fan.
Figure 2:
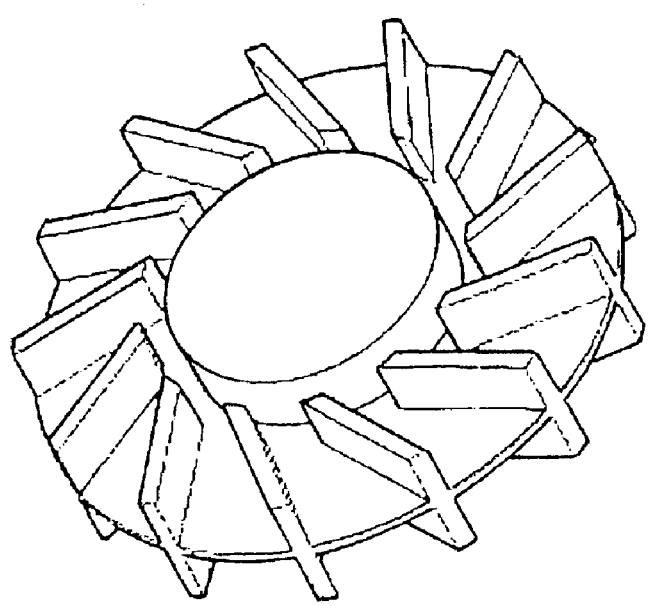
FIG. 2 is a perspective view to show a second conventional dispensing fan.
Figure 3:
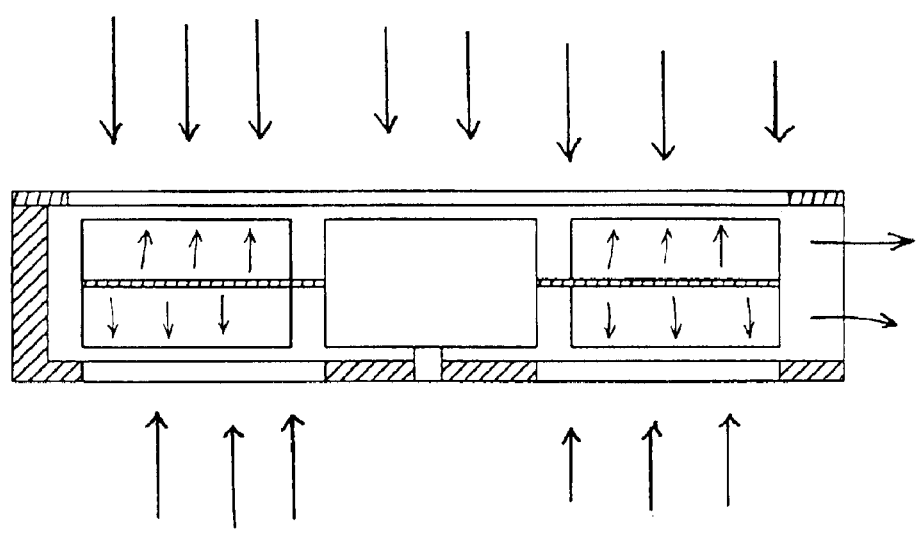
FIG. 3 is a cross sectional view to show the second conventional dispensing fan.
Figure 4:
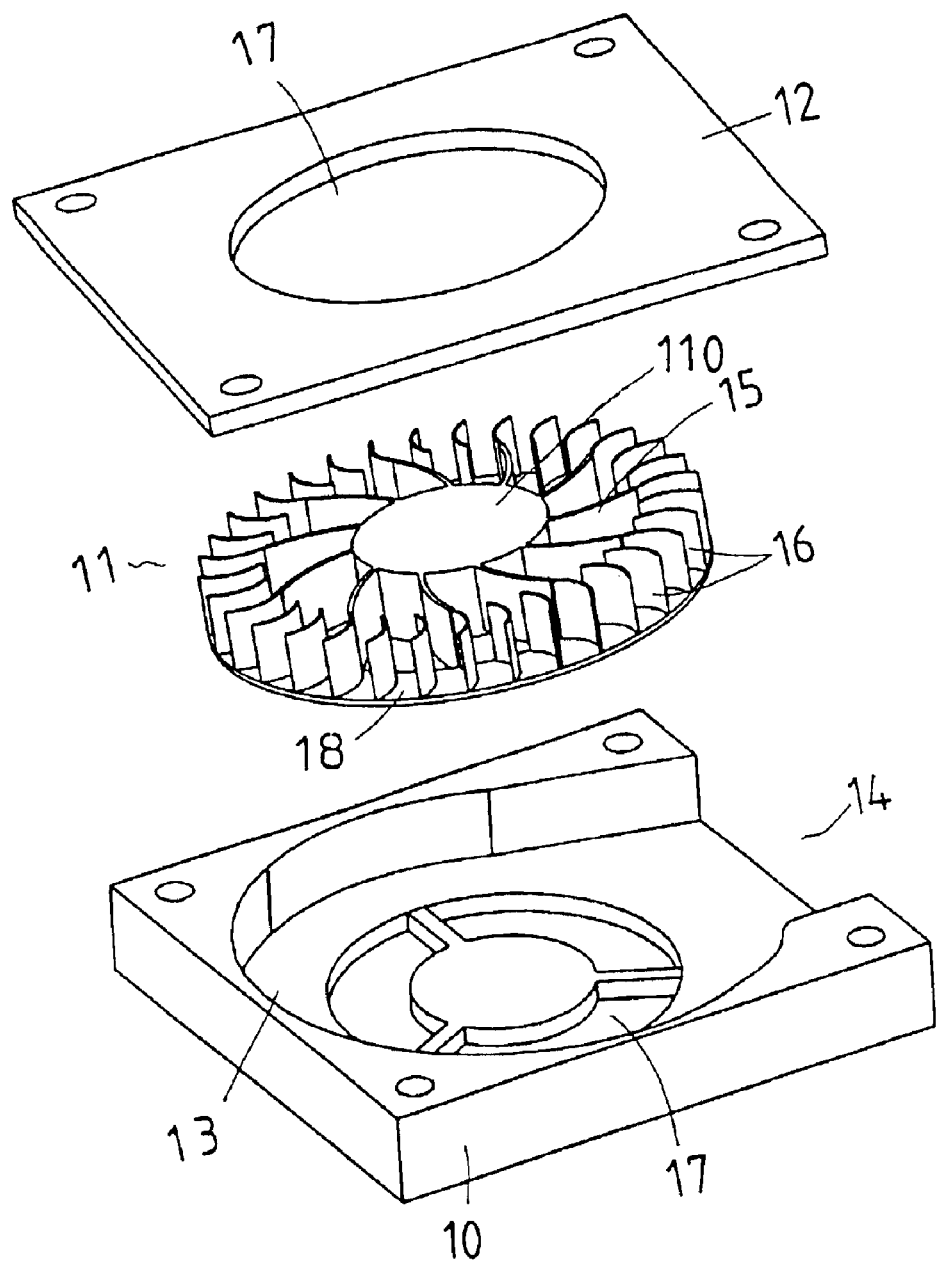
FIG. 4 is an exploded view to show the heat dispensing fan of the present invention.
Figure 6:
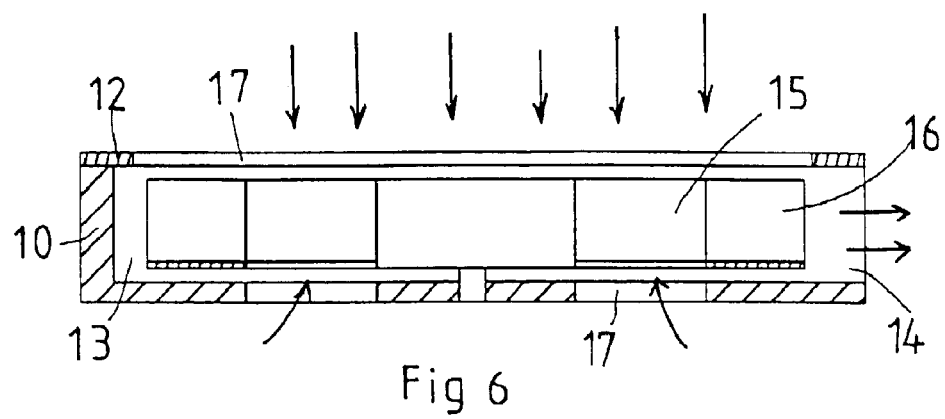
FIG. 6 is a cross sectional view of the heat dispensing fan of the present invention.
Figure 5:
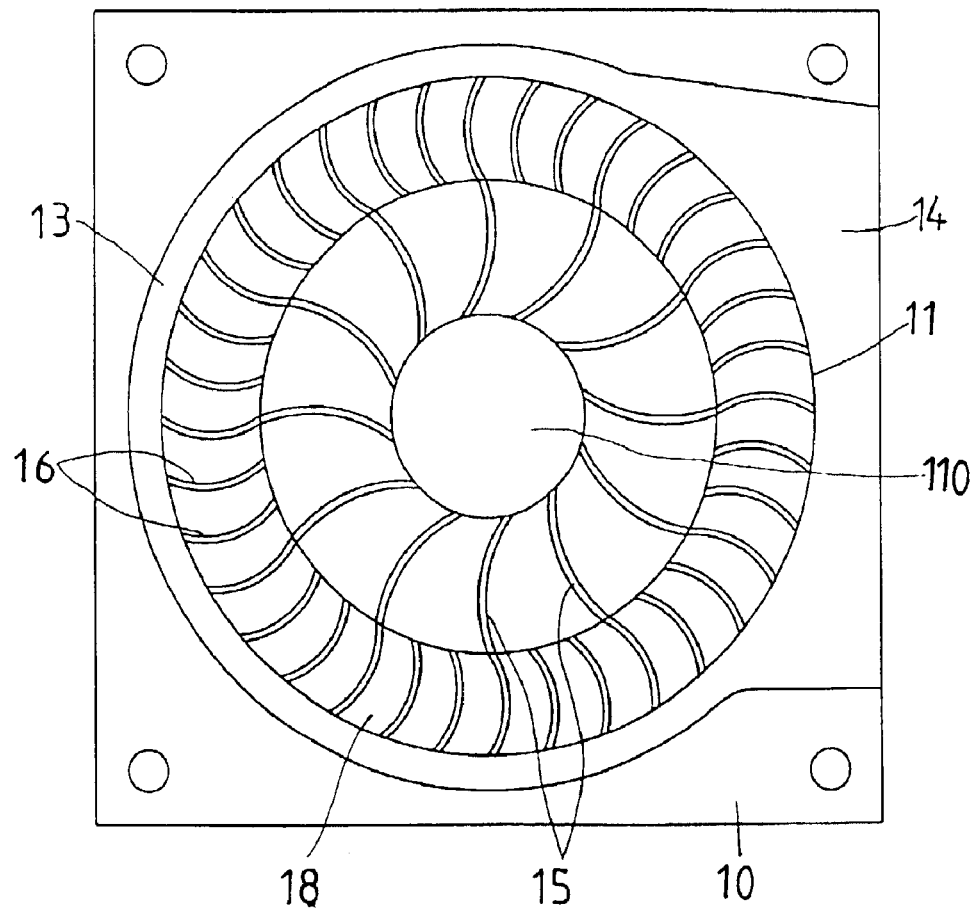
FIG. 5 is a top view of the heat dispensing fan of the present invention.

Referring to FIGS. 4 to 6, the heat dispensing fan of the present invention comprises a hub 10 having a recess 13 defined in a top thereof and communicating with a side outlet 14. Three apertures 17 are defined through the hub 10 and communicate with the recess 13.

A fan member 11 has a ring-shaped base plate 18 and a protrusion 110 extends from a center of a top of the base plate 18. A plurality of first curve blades 15 extend from the protrusion 110 and located on a top of the base plate 18. A plurality of second curve blades 16 are located on the top of the base plate 18 and each first curve blade 15 is connected to one of the second curve blades 16. A top cap 12 is connected to the hub 10 and having a hole 17 defined therethrough.

Air can be sucked from the hole 17 in the top cap 12 and the apertures 17. Because the blades 15, 16 are curved so that the air flow can smoothly flow via the curve surface of the blades 15, 16 and out from the side outlet 14. The ring-shaped base plate 18 does not stop the air flow so that the air can be sucked into the hub 10 in a large amount and heat is brought out efficiently. A curvature of the first curve blades 15 is opposite to a curvature of the second curve blades 16.

Figure 7:
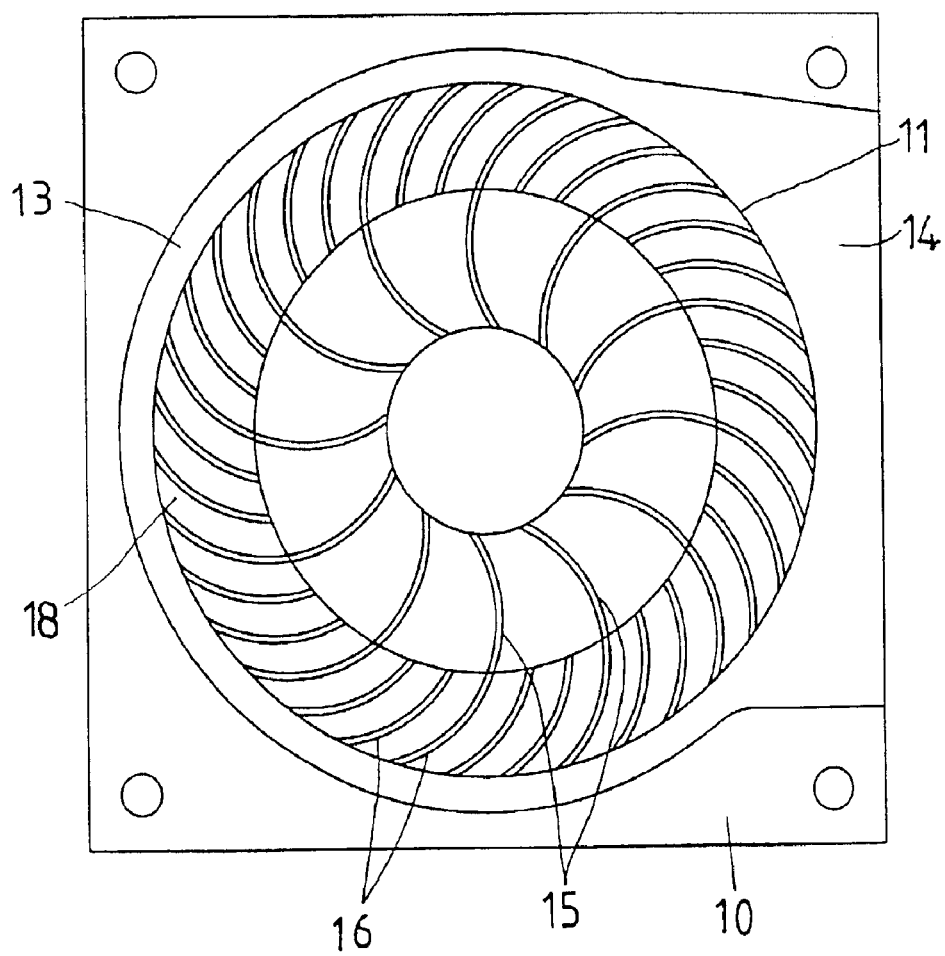
FIG. 7 shows another embodiment of the heat dispensing fan of the present invention.
Figure 8:
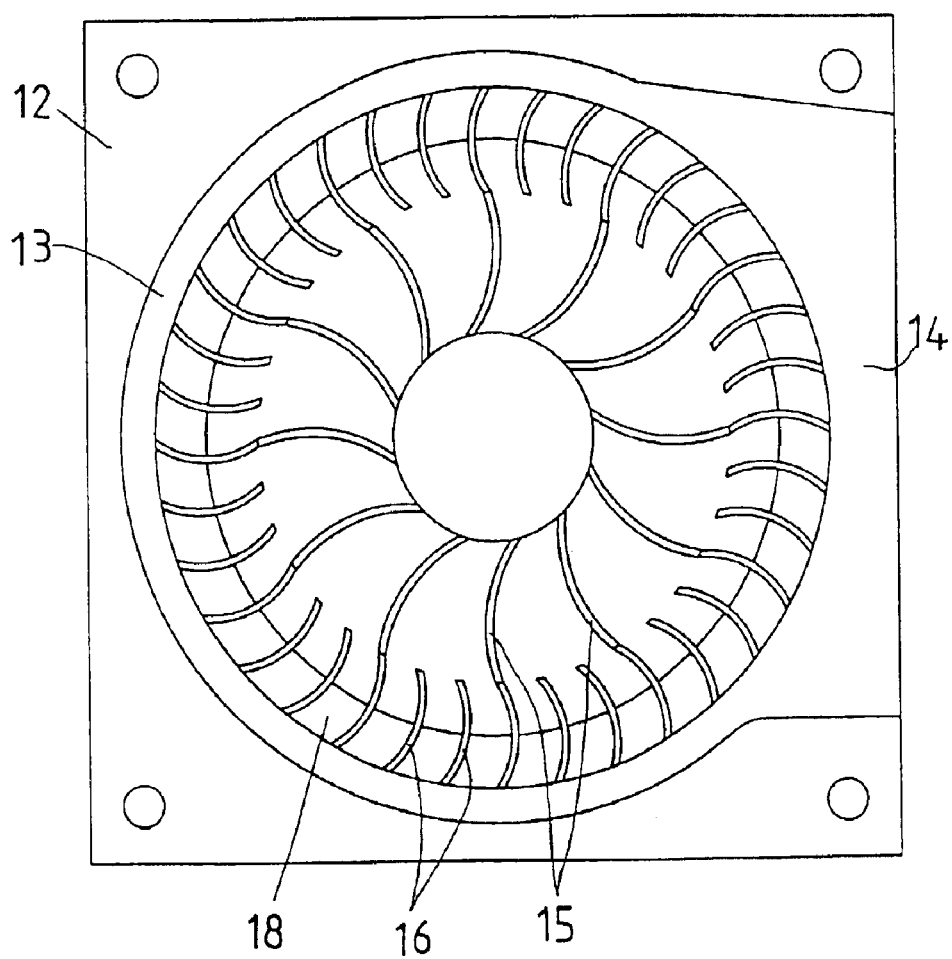
FIG. 8 shows yet another embodiment of the heat dispensing fan of the present invention.

FIG. 7 shows that a curvature of the first curve blades 15 and the second curve blades 16 are the same. FIG. 8 shows that an end of each of the second curve blades 16 extends beyond an inner periphery of the ring-shaped base plate 18. By this arrangement, the area that the second curve blades 16 is increased.

While we have shown and described the embodiment in accordance with the present invention, it should be clear to those skilled in the art that further embodiments may be made without departing from the scope of the present invention.

What is claimed is:

1. A heat dispensing fan comprising:

a hub having a recess defined in a top thereof and communicating with a side outlet, apertures defined through the hub and communicating with the recess;

a fan member having a ring-shaped base plate and a protrusion extending from a center of a top of the base plate, a plurality of first curve blades extending from the protrusion and on a top of the base plate, a plurality of second curve blades located on the top of the base plate and each first curve blade connected to one of the second curve blades, a curvature of the first curve blades being opposite to a curvature of the second curve blades; and, a top cap connected to the hub and having a hole defined therethrough.

2. The heat dispensing fan as claimed in claim 1, wherein an end of each of the second curve blades extends beyond an inner periphery of the ring-shaped base plate.

3. A heat dispensing fan comprising:

a hub having a recess defined in a top thereof and communicating with a side outlet, apertures defined through the hub and communicating with the recess;

a fan member having a ring-shaped base plate and a protrusion extending from a center of a top of the base plate, a plurality of first curve blades extending from the protrusion and on a top of the base plate, a plurality of second curve blades located on the top of the base plate and each first curve blade connected to one of the second curve blades, an end of each of the second curve blades extending beyond an inner periphery of the ring-shaped base plate; and, a top cap connected to the hub 10 and having a hole defined therethrough.

4. The heat dispensing fan as claimed in claim 3, wherein a curvature of the first curve blades and the second curve blades are the same.

5. The heat dispensing fan as claimed in claim 3, wherein a curvature of the first curve blades is opposite to a curvature of the second curve blades.

* * * * *